US011026356B2

(12) United States Patent  (10) Patent No.: US 11,026,356 B2
Soler et al.  (45) Date of Patent: Jun. 1, 2021

(54) ELECTRICAL DEVICE AND SHIELDING METHOD

(71) Applicant: Hewlett-Packard Development Company, L.P., Houston, TX (US)

(72) Inventors: Marc Soler, Sant Cugat del Valles (ES); Javier Gonzalez, Sant Cugat del Valles (ES); Jordi Oriol, Sant Cugat del Valles (ES)

(73) Assignee: Hewlett-Packard Development Company, L.P., Spring, TX (US)

( * ) Notice: Subject to any disclaimer, the term of this patent is extended or adjusted under 35 U.S.C. 154(b) by 0 days.

(21) Appl. No.: 16/098,114

(22) PCT Filed: Jul. 15, 2016

(86) PCT No.: PCT/EP2016/066916
§ 371 (c)(1),
(2) Date: Oct. 31, 2018

(87) PCT Pub. No.: WO2018/010814
PCT Pub. Date: Jan. 18, 2018

(65) Prior Publication Data
US 2019/0141866 A1  May 9, 2019

(51) Int. Cl.
*H05K 9/00* (2006.01)
*H05K 1/09* (2006.01)
*H05K 1/11* (2006.01)

(52) U.S. Cl.
CPC ............ *H05K 9/0037* (2013.01); *H05K 1/09* (2013.01); *H05K 1/115* (2013.01); *H05K 9/0033* (2013.01)

(58) Field of Classification Search
CPC ........ H05K 9/0037; H05K 1/09; H05K 1/115; H05K 9/0033
See application file for complete search history.

(56) References Cited

U.S. PATENT DOCUMENTS 4,739,453 A * 4/1988 Kurokawa ........... H05K 9/0039
174/250
5,504,659 A * 4/1996 Acatay ................. H05K 9/0037
361/816

(Continued)

FOREIGN PATENT DOCUMENTS

JP         H088573       1/1996
WO      WO-9216094     9/1992

OTHER PUBLICATIONS

Walter, P., et al., "Thru Wall, Shielded Filtered Signal Propagation on Two-Sided Circuit Boards", Motorola, XP 000657404, Mar. 1997, 2 pages.

*Primary Examiner* — James Wu
*Assistant Examiner* — Hung Q Dang
(74) *Attorney, Agent, or Firm* — HP Inc. Patent Department

(57) ABSTRACT

An electrical device comprises a printed circuit board, a first contact portion, a second contact portion, a first conductive wall and a second conductive wall. The printed circuit board has a first surface and a second surface, on which the first contact portion and the second contact portion are disposed, respectively. The first conductive wall and the second conductive wall are in electrical contact with the first contact portion and the second contact portion, respectively. The first contact portion and the second contact portion are offset from one another in a direction parallel to at least one of the first surface and the second surface.

19 Claims, 13 Drawing Sheets

(56) References Cited

U.S. PATENT DOCUMENTS

| | | | |
|---|---|---|---|
| 5,761,046 A | 6/1998 | Hein et al. | |
| 6,037,846 A * | 3/2000 | Oberhammer | H01R 13/7195 |
| | | | 174/367 |
| 6,150,606 A * | 11/2000 | Matsumoto | H05K 9/0016 |
| | | | 174/351 |
| 6,242,690 B1 * | 6/2001 | Glover | H05K 9/0037 |
| | | | 174/367 |
| 7,170,165 B2 | 1/2007 | Berto et al. | |
| 8,331,099 B2 | 12/2012 | Geissler et al. | |
| 8,674,885 B2 | 3/2014 | Leiba et al. | |
| 9,198,301 B2 | 11/2015 | Fathauer | |
| 2015/0153784 A1 | 6/2015 | Wu | |

\* cited by examiner

ELECTRICAL DEVICE AND SHIELDING METHOD

BACKGROUND

Electronic or electrical devices in an industrial or media processing environment, for example, create and are subject to electromagnetic emission. Such electronic or electrical devices may comprise printer controllers, heating controllers or any other electronic control system. An electrically conductive enclosure can be used for electromagnetically shielding the electronic or electrical device. An electrically conductive contact portion can be disposed on each side of a printed circuit board (PCB) of the electrical device providing both electrical and mechanical contact with the enclosure. The enclosure may be connected to a reference voltage, such as ground.

BRIEF DESCRIPTION OF DRAWINGS

For a detailed understanding, various Examples will now be described with reference to the accompanying drawings in which.

DETAILED DESCRIPTION

Figure 1:
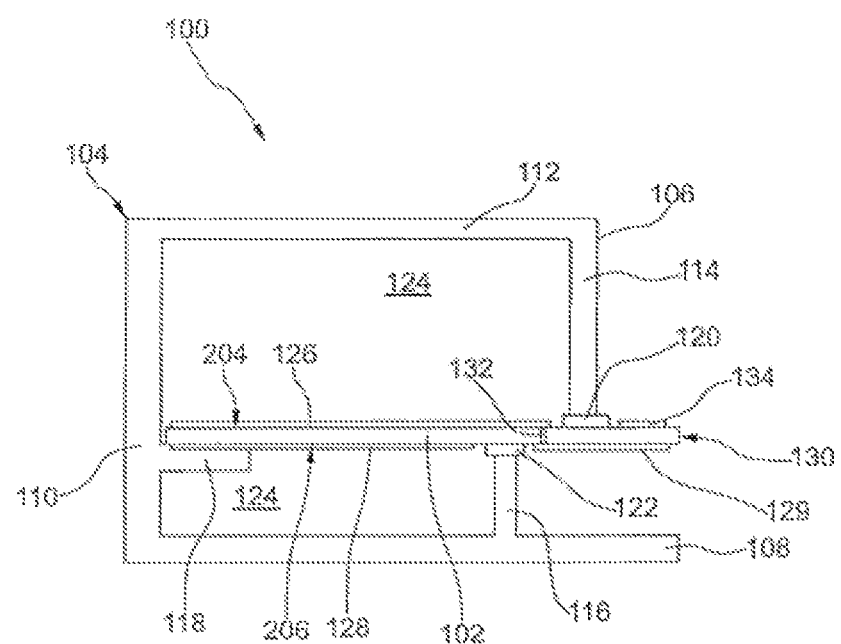
FIG. 1 schematically shows a cross-sectional view of a first example of an electrical device.

Examples described herein relate to an electrical device and a method for shielding a printed circuit board of an electrical device. The structural features schematically shown in the drawings are therefore not true to scale, i.e. some features are shown in an exaggerated scale for a better overview. Unless indicated otherwise, same reference numerals are used for the same functional or structural features.

Generally, the electrical device refers to any electrical device or at least a part of an electrical device that has electrical pails or electronic components mounted on a printed circuit hoard. The electrical parts or electronic components are at least partially connected to one another by respective conductive tracks. For example, the electrical device may be part of at least one of a printed media handling or processing device, such as a printer, including a large format printer and 3-D printer, a printed media post-processing station, a scanner, a copy machine, a computing device including a desktop computer, laptop computer, tablet, server and workstation, a communication device, such as a smart phone, a signal processing device and a controlling device. The electrical device is, for example, a printer controller, a computer card, a server card, a network device, a communication device, a controller, etc. Furthermore, the electrical device may include or be an integrated circuit.

A printed circuit hoard (PCB) generally comprises at least one of a substrate, electrical parts, electronic components, conductive tracks and pads. The substrate can be made of a nonconductive material, such as a dielectric composition material. For example, the substrate material can contain a matrix of an epoxy resin, a reinforcement comprising a woven or nonwoven, glass fibers or paper and sometimes a filler, e.g. ceramics. The PCB is sometimes also referred to as a printed circuit assembly (PCA) or a circuit board.

The electrical parts or the electronic components generally refer to units or devices used to affect elections or their associated fields. For convenience, electrical parts and electronic components are summed up by the term electrical parts in the following. An electrical part can be any basic discrete device or physical entity that is part of the electrical device. The electrical parts comprise at least one of passive parts, active parts or electronic parts. For example, the electrical parts can comprise at least ore of a capacitor, inductor, transformer, transistor, vacuum tube, diode, triode, memristor, electric actuator, microcontroller, lamp, display element, discharge device, polish source, RC circuit, NC circuit, filter, transducer, electromagnetic or piezoelectric device for generating acoustic signals and integrated circuit.

The PCB can have a laminar shape, e.g. the shape of a plate. The PCB comprises a first surface and a second surface that are opposite to each other. At least one of the first and the second surfaces is a planar surface suitable for the electrical parts to be mounted on. Different mounting methods can be applied for mounting the electrical parts depending on the type of the respective electrical part. For example, the electrical parts are soldered, screwed, glued, or just laid upon on the substrate of the PCB. Furthermore, some of the electrical parts have electrical terminals to be connected with other electrical parts.

A conductor path communicates electrical signals. Hence, the conductor path is capable of electrically connecting the electrical parts of the electrical device. Conductor paths are deposited on or integrated with the substrate of the PCB. The conductor path is made of an electrically conductive material, e.g. copper.

The conductor path usually comprises a number of electrical tracks each capable of conducting electrical signals. For example, the conductor path comprises a first track disposed on one surface of the PCB and a second track disposed on the opposite surface of the PCB. A plurality of electrical tracks disposed an the top surface is referred to as top PCB trades. A plurality of electrical tracks disposed on the bottom surface is referred to as bottom PCB trades. The electrical tracks connect the electrical parts to one another, to a respective terminal, to an external electrical device, etc.

The term conductive refers to the electrically conductive property of the respective element or unit. A conductive via refers to an electrical conductor disposed inside the PCB so as to extend between lire two opposite surfaces of the PCB. For example, the conductive via connects one of the top PCB tracks to one of the bottom PCB tracks. The conductive via is made of an electrically conductive material, e.g. copper. The conductive via can be formed within a through hole penetrating the PCB. The conductive via can be provided so as to be arranged perpendicular to at least one of the top and bottom surfaces of the PCB.

FIG. 1 to 4 show an example of an electrical device 100. The electrical device 100 comprises a PCB 102 enclosed by a housing which in the following is referred to as a conductive enclosure 104. The conductive enclosure 104 comprises a top cover 106, a bottom plate 108 and a rear wall 110. The top cover 106 is made from a single piece sheet metal and comprises a horizontal cover wall 112 end a vertical wall 114 that are perpendicular to each other. In another example, the horizontal cover wall 112 and the vertical wall 114 can be separate parts separate parts that are joined together.

A supporting wall 116 protrudes vertically from a top surface of the bottom plate 108. A protruding portion 118 protrudes horizontally from the rear wall 110. The PCB 102 rests on a top surface of the protruding portion 118 and the supporting wall 116. The PCB 102 is arranged horizontally, i.e. the height of the supporting wall 116 approximately matches the vertical position of the protruding portion 118. In this example, the vertical wall 114 corresponds to the first conductive wall and the supporting wall 116 corresponds to the second conductive wall in terms of the claims. In this example, the vertical wall 114 and the supporting 116 together form a front wall of the enclosure 104.

In another example (not shown), a step can be formed between the rear wall 110 and the bottom plate 108 instead of the protruding portion and the PCB 102 rests on the step. In another example, a bracket or other fixture can be provided for supporting the PCB 102 at or near the rear wall 110. In a further example, the PCB 102 can remain unsupported at its tear edge, i.e, at the side facing the rear wall. Instead, it could be supported along one or both of its side edges; or, it could be supported only at the front wall, between the vertical wall 114 and the supporting wall 116.

A top contact portion 120 is provided on a top surface 204 of the PCB 102 in a position corresponding to the vertical wall 114 of the top cover 106. Accordingly, in a closed state of the conductive enclosure 104, the vertical wall 114 of the top cover 106 is in physical contact with the top contact portion 120.

A bottom contact portion 122 is provided on the bottom surface 206 of the PCB 102 in a position corresponding to the supporting wall 116. Accordingly, the supporting wall 116 is in physical contact with the bottom contact portion 122. The PCB 102 thereby rests on top of the supporting wall 116.

The conductive enclosure 104 is at the least partially made of an electrically conductive material, e.g. iron or steel. The horizontal cover wall 112 and the vertical wall 114 of the top cover 106 can be formed from metal sheets joined to each other, or they can be formed from any single metal sheet which is bent to shape. The bottom plate 108, the rear wall 110 and the support portion 116 can be formed from metal sheets joined to one another. In another example, the top cover 106, the bottom plate 108 and the rear wall 110 can be at least partially coated by or sandwiched between non-conductive material. The conductive enclosure 104 shields electromagnetic emission, in a certain wavelength range according to the Faraday enclosure.

The top contact portion 120 and the bottom contact portion 122 are at least partially made of an electrically conductive material, e.g. copper. At the least one of the lop contact portion 120 and the bottom contact portion 122 is connected to a reference voltage. The reference voltage is, for example, ground.

Figure 5:
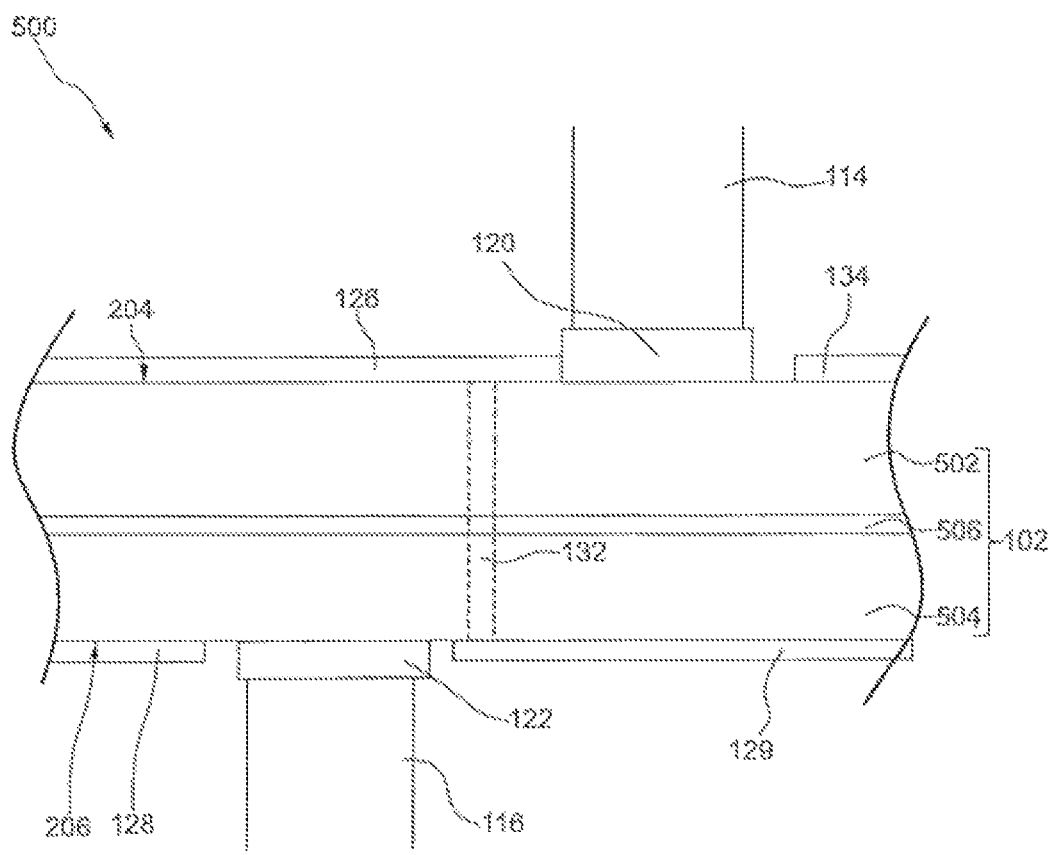
FIG. 5 schematically shows a partial cross-sectional view of a further example of an electrical device.

The top and bottom contact portions 120, 122 define an inner area 124 that is bordered by the top cover 106, the rear wall 110 and the bottom plate 108 of the conductive enclosure 104. Electrical peats (not shown) can be mounted on one or both of the PCB surfaces 204, 206. The electrical parts are connected to one another by respective conductive tracks. For example, at least one of the electrical parts has a terminal that can be electrically contacted by a conductive track. The conductive tracks are deposited on or integrated into the PCB 102. The conductive tracks are disposed on one or both of the PCB surfaces 204, 206. In a further example, intermediate PCB tracks are provided on further levels within a multilayer PCB as shown in FIG. 5. The conductive tracks communicate electrical signals. The conductive tracks are made of mi electrically conductive material, e.g. copper.

In the example, the major part of the PCB 102, carrying electrical parts, is within the inner area 124 of the enclosure 104, with it front or outer edge 130 of the PCB 102 extending out of the enclosure 104 between the vertical wall 114 and the supporting portion 116. A front portion of the PCB 102, close to the front or outer edge 130, can carry an external electrical contact once before for connecting the electrical device 100/PCB 102 two external supply and/or signal lines.

The conductive tracks of FIG. 1 include top PCB trucks 126 and bottom PCB tracks 128 disposed on the top surface 204 and the bottom surface 206, respectively, of the PCB 102. The inner area 124 corresponds to a first area in terms of the claims, whereas the area outside of the conductive enclosure 104 corresponds to a second area in terms of the claims.

Figure 2:
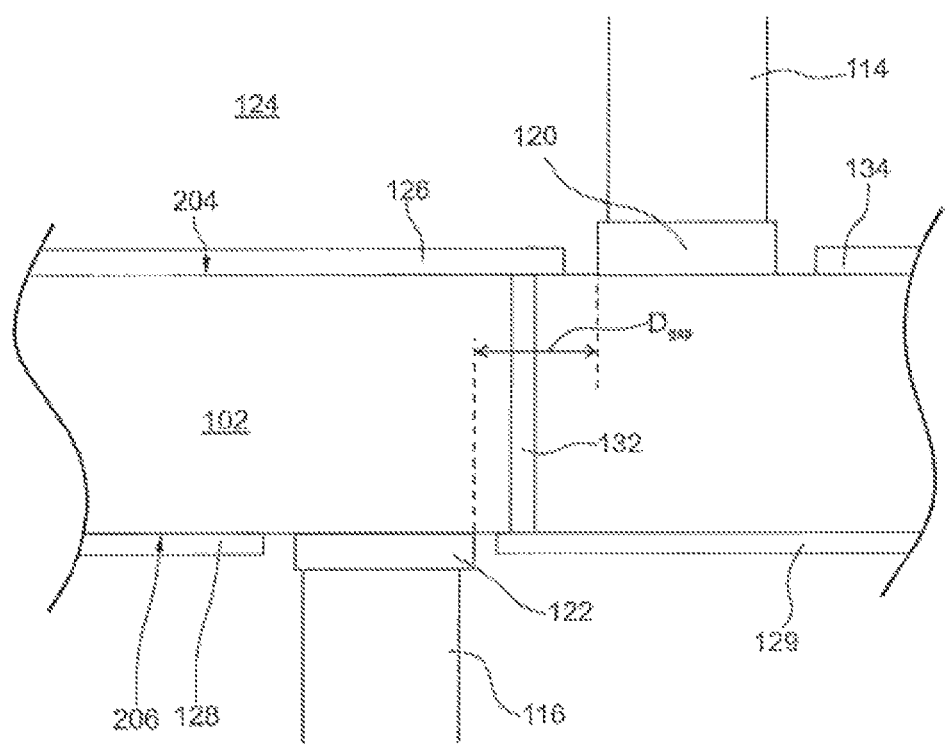
FIG. 2 schematically shows a partial cross-sectional view of the electrical device of FIG. 1.

In the drawings, the top PCB tracks 126, the bottom PCB tracks 128 and the intermediate PCB tracks (see FIG. 5) are illustrated as a respective layer. It is understood that, in a top view, the conductive tracks can have any shape. Further, the conductive tracks may connect the electrical parts mounted on the opposite surfaces 204, 206 of the PCB 102. For example, the conductive tracks disposed in different layers of the PCB 102 may be interconnected so as to enable an electrical connection between these layers As shown in FIGS. 1 and 2, the top contact portion 120 and the bottom contact portion 122 are positioned so as to be offset from each other on the respective opposite surfaces 104, 106 of the PCB 102. The contact portions 120, 122 are offset from each other in a direction parallel to at least one of the top surface 204 and the bottom surface 206. In the example shown in FIGS. 1 and 2, the contact portions 120, 122 are spaced from each other by a gap distance $D_{gap}$ in the direction parallel to the top surface 204. The gap distance $D_{gap}$ is chosen so as to provide sufficient area for disposing the electrical connection, e.g. an electrical via, between the top and bottom surfaces 204, 206. The magnitude of the gap distance $D_{gap}$ depends on the system it is implemented. For example, the gap distance $D_{gap}$ is 0.1 to 10 cm. According to further examples, $D_{gap}$ is 0.2 to 5 cm or 0.5 to 2 cm.

In the following example, the electrical connections of electrical parts disposed on the top and bottom surfaces 204, 206 of the PCB 102 and the respective conductive tracks are described with reference to a single electrical part mounted on the top surface 204 and connected by a single top PCB track 126 and a single bottom PCB track 128. It is understood that the features described below also are applicable to a plurality of electrical parts as well as to an electrical part mounted on the bottom surface 206 of the PCB 102.

Multiple electrical parts may be connected to a common terminal connected by a conductive track. Further, electrical parts may be mounted on either surface 204, 206 and/or may be connected to an external contact.

The top PCB track 126 extends on the top surface 204 towards the front edge 130 and the top contact portion 320 beyond the position of the bottom contact portion 122 on the bottom surface 206. The bottom PCB track 328 extends on the bottom surface 206 towards the front edge 130 and the bottom contact portion 322 beyond the position of the top contact portion 120 on the fop surface 204. Hence, the top PCB track 126 and the bottom PCB track 128 partially overlap and cover the gap area between the contact portions 120, 122 on the respective surface 104, 106.

An electrical via 132 runs between the top PCB track 126 and the bottom PCB track 128 through the PCB 102 inside the gap area. The electrical via 132 is made of an electrically conductive material, e.g. copper, and communicates electrical signals. As a result, electrical signals can be communicated from the top PCB track 126 to the bottom PCB track 128 and vice versa.

In a closed state of the conductive enclosure 104, the vertical wall 114 and the support wall 116 together with the PCB 102 close the inner area 124. The electrical connection between the bottom PCB track 128, the electrical via 132 and the top PCB track 126 allow for routing the electrical connection provided by the PCB tracks 126, 128 between the inside and the outside of the conductive enclosure 104.

The external electrical contact 134 is formed on the top surface 204 in an area between the top contact portion 120 and fire outer edge 130 of the PCB 102. The electrical contact 134 can be connected to the bottom PCB track 128 on the opposite bottom surface 206, e.g. by an additional electrical via (not shown). The electrical contact 134 can be electrically connected to an external electrical device, e.g. a signal generator, power source, trigger device, etc. The electrical contact 134 thereby allows for an electrical access to the electrical parts mounted on the PCB 102 inside the inner area 124 from the outside of the conductive enclosure 104.

In another arrangement as shown in FIGS. 1 and 2 the top contact portion 120 can be spaced farther from the outer edge 130 than the bottom contact portion 122 (not shown). Also in this case, the lop contact portion 320 and the bottom contact portion 122 may be offset by $D_{gap}$ as described above, thereby forming a gap in between. Accordingly, the electrical part mounted in the inner area 124 can be connected by top and bottom PCB tracks 126, 128. The bottom PCB track 128 extends on the bottom surface 206 towards the bottom contact portion 122 so as to partially cover the above-mentioned gap area. On the top surface 204, accordingly, the top PCB track extends from the outer edge 130 towards the top contact portion 120 so as to partially cover the gap area. The electrical via 132 within the gap connect connects the top PCB track 126 and the bottom PCB track 128 and enables routing the connections of the electrical part between the inside and the outride of the conductive enclosure 104.

Figure 3:
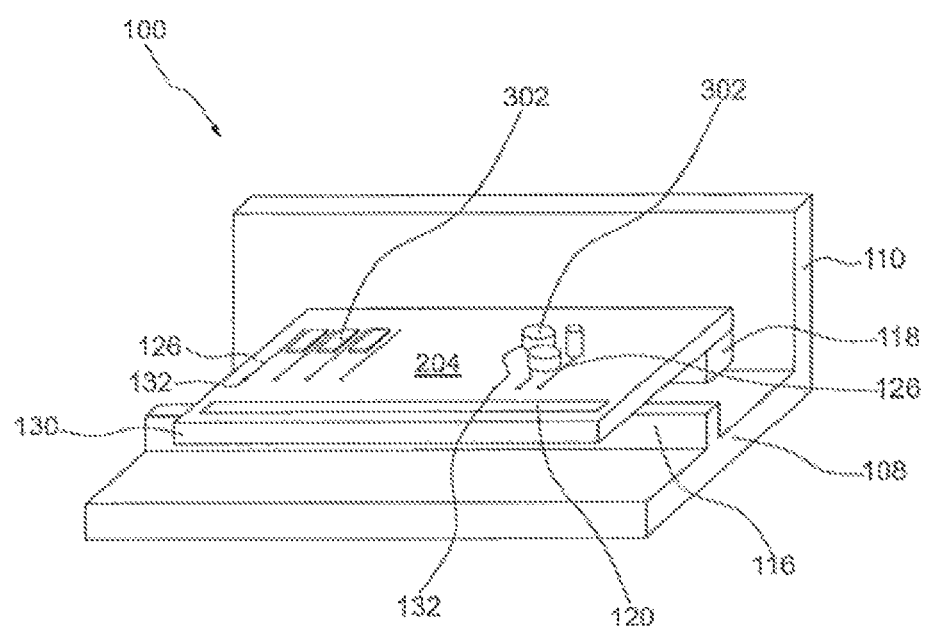
FIG. 3 schematically show a perspective view of the electrical device of FIG. 1 without a top cover.

FIG. 3 shows a schematic perspective view of the electrical device 100 without the top cover 106. FIG. 3 shows multiple electrical parts 302 that are electrically connected by respective top PCB tracks 126. Although not shown in FIG. 3, the electrical parts 302 may be at least partially interconnected. FIG. 3 illustrates a simplified and schematically view of the electrical device 100. In particular, the electrical parts 302 can comprise a larger number of electrical parts and components than illustrated in FIG. 3.

Accordingly, the top PCB tracks 126 may be arranged more complexly than illustrated in FIG. 3. As mentioned above, further electrical parts may be mounted on the bottom surface 206 of the PCB 102 as well. Further, electrical parts mounted on the top surface 204 of the PCB 102 maybe connected by bottom PCB tracks 128 and vice versa.

The top PCB tracks 126 run on the top surface 204 from the respective electrical parts 302 towards the top contact portion 120 and terminate at the electrical via 132. As shown in FIG. 3, one electrical via 132 is provided for each of the top PCB tracks 126. Even though not shown in FIGS. 3 and 4, external contacts 134 are provided on the top surface 204 between the top contact portion 120 and the outer edge 130 of the PCB 102.

Figure 4:
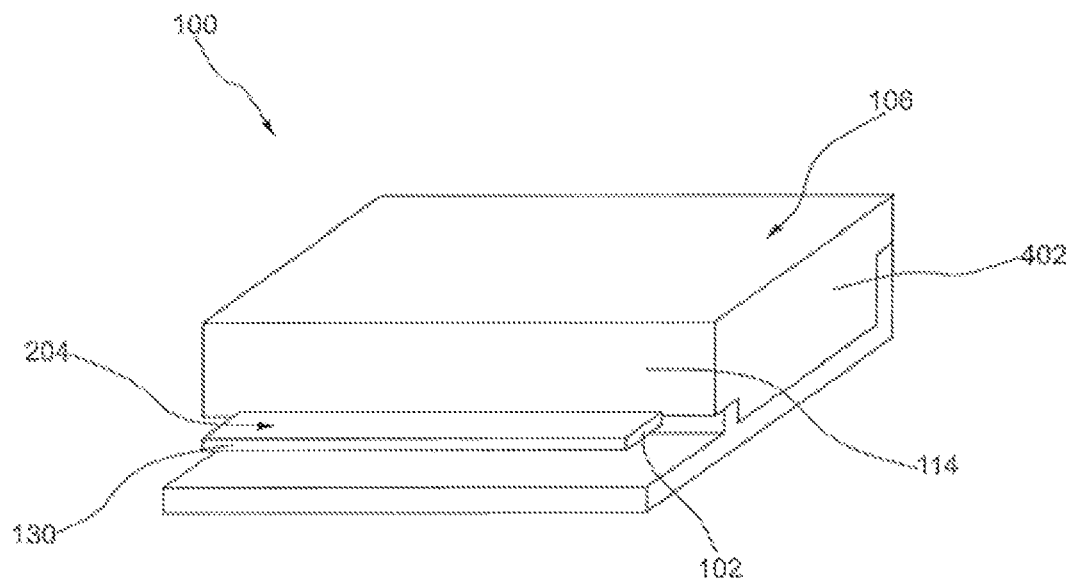
FIG. 4 schematically shows another perspective view of the electrical device of FIG. 1 with the top cover being attached.

FIG. 4 shows a schematic perspective view of the electrical device 100 with the top cover 106 attached. The top cover 106 also comprises two side panels 402 in order to cover the inner area 124 from all skies. In another example, the side panels 402 can be integrally formed with the bottom plate 108 and the rear wall 310 (not shown). The top cover 106 shields the electrical parts 302 inside the inner men 124 from the front, from above and from the sides. The vertical wall 114 abuts against the top contact portion 120 from above and is thereby supported on the PCB 102. Because the inner area 124 is enclosed at all sides, the vertical wall 114 and the supporting wall 116 being in physical and electrical contact with the contact portions 120 and 122, respectively, the conductive enclosure 104 can provide a perfect electromagnetic shielding of the electrical device 100. The only gap remaining in this shielding him material of the PCB 102.

As shown in MG. 4, a part of the PCB 102 protrudes from the conductive enclosure 104. Through the electrical via 132 between the top and bottom PCB tracks 126, 128 as explained above, the electrical parts 302 in the inside of five conductive enclosure 104 can be electrically accessed even when the conductive enclosure 104 is closed. The example electrical device 100 allows for electromagnetic shielding of the electrical parts of the electrical device by means of the conductive enclosure 104 while the electrical parts can be electrically accessed, from the outside of the conductive enclosure.

FIG. 5 shows another example of an electrical device 500. In particular, the electrical device 500 is a modification of the electrical device 100 as shown in FIG. 1 to 4. The electrical device 500 comprises a PCS 102 which comprises a top layer 502 and a bottom layer 502. A top surface of the top layer 502 and a bottom surface of the bottom layer 504 form a top surface 204 and a bottom surface 200 of the PCB 102, respectively. An intermediate layer 506 is formed between the top layer 502 and the bottom layer 504. Intermediate PCB tracks are provided in the intermediate layer 506.

Electrical parts (not shows) can be mounted on either one of the top surface 204 and the bottom surface 206. The electrical parts can be electrically connected to each other and can be routed to the outside of the conductive enclosure 104 via the top PCB track 126 and the bottom PCB track 128. Accordingly, the electrical part can be accessed from the outside of the conductive enclosure 104.

Additionally, at least one further electrical element (not shown) can be contacted through the intermediate PCB track 506. The intermediate PCB track 506 can be connected to either one of the top and bottom PCB tracks 126, 128 through a respective via. Additionally, the intermediate PCB tracks 506 can be routed towards the front edge 130 of the PCB 102 to be accessible from outside of the conductive enclosure 104.

Figure 6:
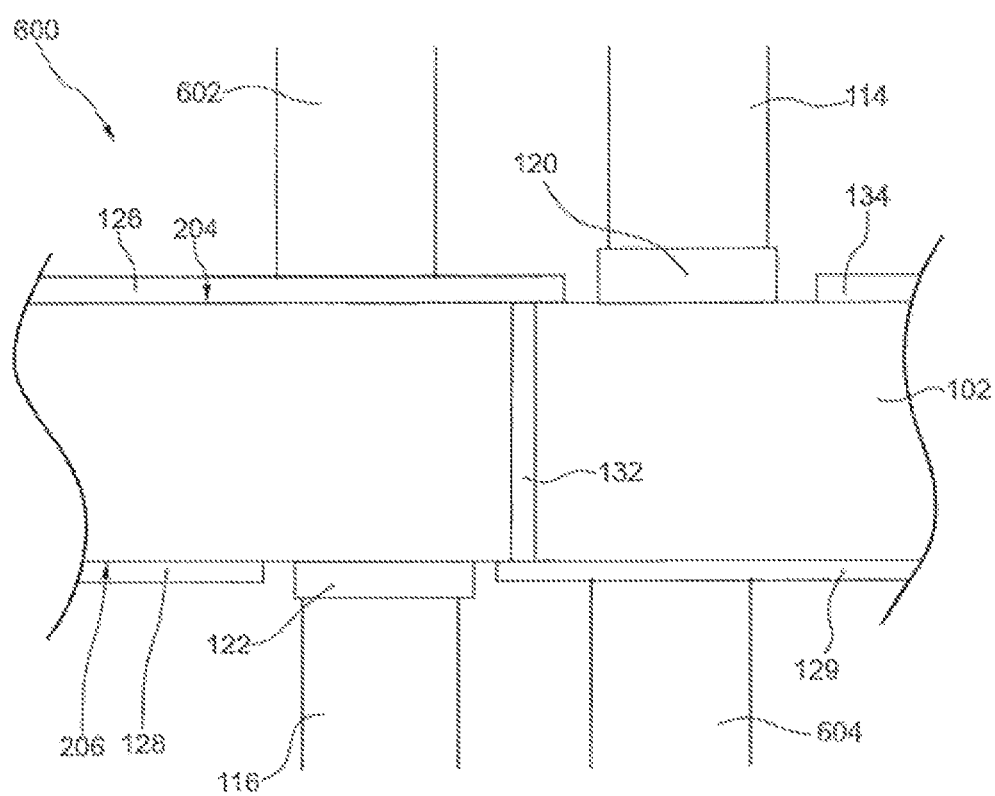
FIG. 6 schematically shows a partial cross-sectional view of a further example of an electrical device.

FIG. 6 shows a further example of an electrical device 600. The electrical device 600 comprises a PCB 102 which can be either single-layered as shown in FIGS. 1 and 2 or multilayered as shown in FIG. 5. The PCB 102 comprises a top surface 204 and a bottom surface 206. A top PCB track 126 is disposed on the top surface 204. A top contact portion 120 is provided on the top surface 404. In addition, electrical contacts 134 may be disposed on the top surface 204 between the outer edge 130 and the top contact portion 120.

A bottom contact portion 122 is mounted on the bottom surface 206 in a position that is offset from the position of the top contact portion 120 in a direction parallel to the bottom surface 206. Further, the positions of the top and bottom contact portion 120, 122 are offset front each other in a direction parallel to the top surface 204. In this example, bottom contact portion 122 is shifted towards the rear wall 110 of the conductive enclosure 104 with respect to the top contact portion 120.

Further, a bottom PCB track 128 is provided on the bottom surface 206, a part of the bottom PCB trade 128 inside the conductive enclosure 104 and another part 129 extending outside of the conductive enclosure towards the front edge 130 of the PCB 102. The top PCB trade 126 and the outside extending portion 129 the bottom PCB track 128 are connected by a conductive via 132 in the "gap area", as explained below. Electrical parts can be mounted on the fop or bottom surfaces 204, 206 of the PCB 102 and can be connected to the top and bottom PCB tracks 126, 128. Inside the conductive enclosure 104, the top and bottom PCB tracks 126, 128 can be corrected by further vias (not shown).

Although not shown in FIG. 6, the electrical device 600 further comprises a conductive enclosure 104 as shown in FIGS. 1, 3 and 4. The conductive enclosure 104 comprises a bottom plate 108, a rear wall 110 and the top cover 106. A reference is made to the description of FIG. 1. The conductive enclosure 104 is made of an electrically conductive material, as described above, and is therefore suitable for shielding electromagnetic emission.

As described above in connection with the electrical devices 100, 500, the vertical wall 114 of the conductive enclosure 104 is in physical contact with the top contact portion 120, thereby being supported on the PCB 102. The bottom contact portion 122 rests on fee supporting wall 116 feat is formed integrally with the bottom plate 108 of fee conductive enclosure 104. The PCB 102 is thereby supported on the supporting wall 516.

The top confect portion 120 is made of an electrically conductive material, e.g. copper. The top contact portion 120 is connected to a reference voltage, e.g. ground. The top contact portion 120 has a substantially flat shape, e.g. the shape of a stripe. The same applies to the bottom contact portion 122. Being in mechanical contact with the vertical wall 114, the top contact portion 120 is also in electrical contact with the vertical wall 114. Similarly, the bottom contact portion 102 is in both mechanical and electrical contact with the supporting wall 116.

The conductive enclosure 104 of this example further comprises an upper support leg 602. The upper support leg 602 is formed integrally with or mechanically coupled to the top cover 106 and the vertical wall 114. In the closed state of the conductive enclosure 104 as shown in FIG. 6, the upper support leg 602 abuts cm and is in physical contact with the top surface 204 of the PCB 102. The upper support leg 602 may be in physical contact with the top PCB tracks 126. The upper support leg 602 can be arranged so as to be aligned with the supporting wall 116 on the bottom surface 206 of the PCB 102. The upper support leg 602 can thereby reduce a mechanical stress exerted by the supporting wall 116 on the PCB 102.

The upper support leg 602 is electrically isolated from the underlying top surface 204 and top PCB tracks 126. For tins purpose, the upper support leg 602 is made of an electrically non-conductive material, e.g. a polymer, ceramic or rubber. In another example, part of the upper support leg 602 which is in contact with the top surface 204 is made of or coated by an electrically non-conductive material, while the rest of the upper support leg 602 is at least partially electrically conductive, e.g. made of the same material as the vertical wall 114. Hence, any electrical current through the upper support leg 602 is blocked.

A lower support leg 604 is provided in physical contact with the bottom surface 206 of the PCB 102. The lower support leg 604 may be in physical contact with the bottom PCB track 128. The lower support leg 604 is arranged so as to be aligned with the vertical wall 114 on the bottom surface 206. Therefore, the lower support leg 206 can contribute to the reduction of a mechanical stress exerted by the vertical wall 114 on the PCB 102.

Similar to the upper support leg 602 as described above, the lower support leg 604 is electrically isolated from the adjacent bottom surface 206 and any bottom PCB tracks 128. For this purpose, the lower support leg 604 is at least partially made of or coated by an electrically non-conductive material such as a polymer, ceramic or rubber, similar to the upper support leg 602 as described above.

Accordingly, the upper support leg 602 and the tower support leg 604 correspond to a first and second isolated tog, respectively, in terms of the claims. The vertical wall 114 and the supporting wall 116 (or their respective branches which are in electrical contact with the top or bottom contact portion) correspond to a first and second conductive leg, respectively, in terms of the claims.

Figure 7:
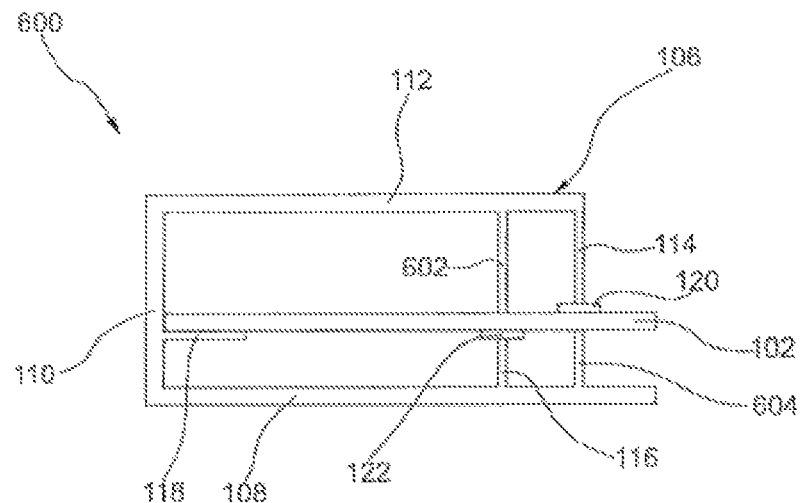
FIG. 7 schematically shows cross-sectional view of a further example of an electrical device.
Figure 8:
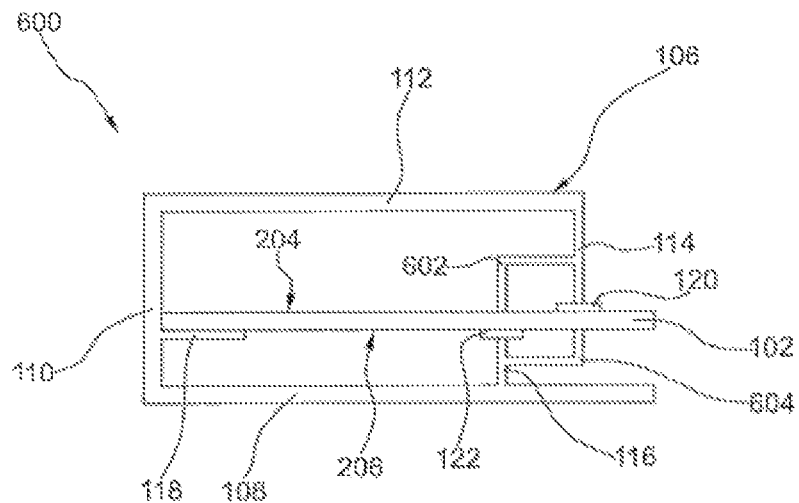
FIG. 8 schematically shows a cross-sectional view of a further example of an electrical device.
Figure 9:
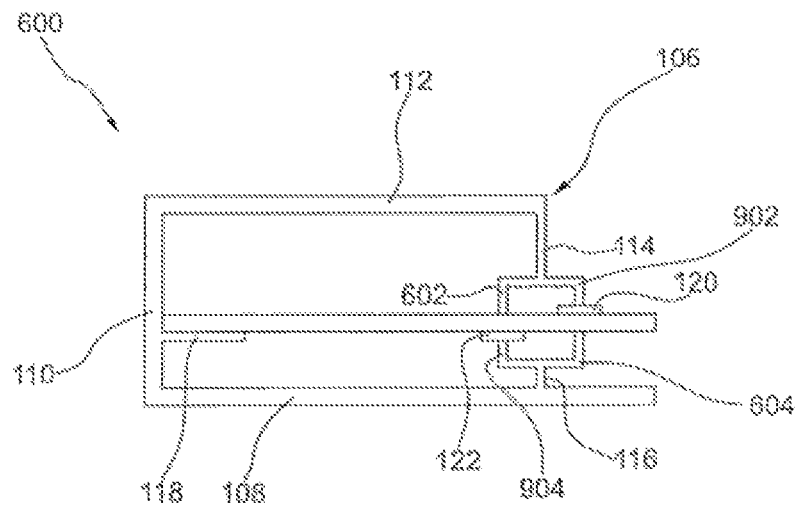
FIG. 9 schematically shows a cross-sectional view of a further example of an electrical device.

FIG. 7 to 9 show examples of the electrical device 600 of FIG. 6. For convenience, the top and bottom PCB tracks 126, 128 are not shown in FIG. 7 to 9. In FIG. 7, both the upper support leg 602 and the vertical wall 114 protrude vertically downwards from the horizontal cover wall 112 of the top cover 106. In FIG. 8, the support togs 602, 604 have a first portion protruding horizontally from the vertical wall 114 and the supporting wall 116 respectively, and a second portion protruding vertically towards the top surface 200 for and the bottom surface 206, respectively.

In FIG. 9, the vertical wall 114 bifurcates into two branches, namely the first upper support tog 602 and an upper conductive leg 902. Similarly, the supporting wall 116 bifurcates into the tower support tog 604 and a lower conductive leg 904. The conductive legs 902, 904 are in physical and electrical contact with the top and bottom contact portions 120, 122, while the support legs 602, 604 are in physical contact with and electrically isolated from the top and bottom surfaces 204, 206.

Figure 10:
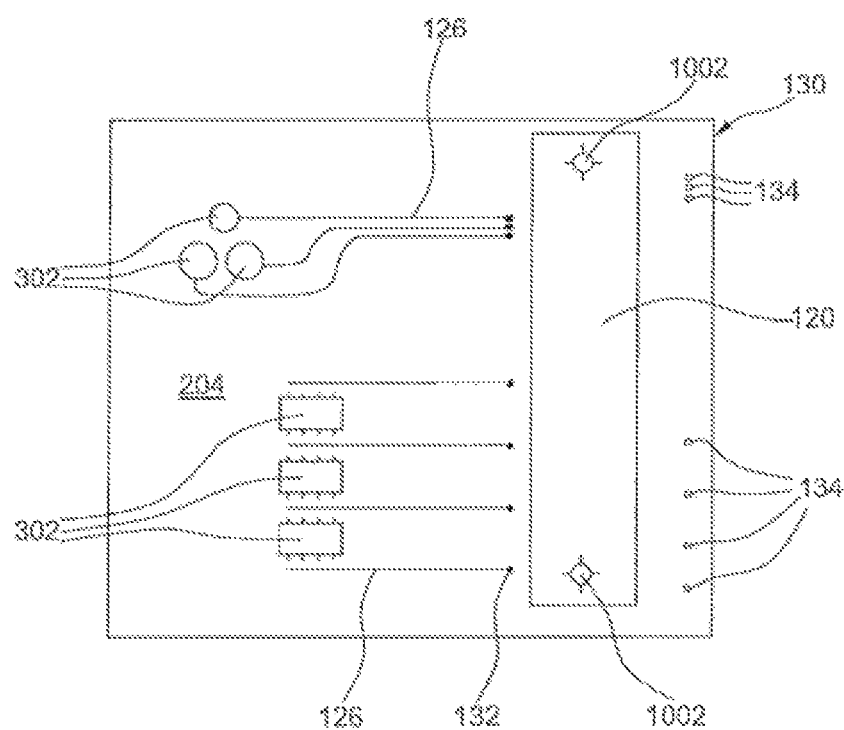
FIG. 10 schematically shows a top view of an example of a PCB of the electrical device.

FIG. 10 shows a schematic a top view of the top surface 204 of the PCB 102. Multiple electrical parts 302 are arranged on the top surface 204. In addition, farther electrical parts may be arranged on the top surface 204 or on the bottom surface 206 of the PCB 102. Further, at toast part of the electrical parts of the electrical device may be interconnected. The electrical pans 302 are connected by respective top PCB hacks 126. The top PCB tracks 126 are in contact with the electrical via 132. The top contact portion 120 has the shape of a rectangle or stripe and is applied on the top surface 204 of the PCB 102 e.g. by being integrated, impregnated, deposited, adhered, etc. For example, during toe manufacture of the PCB 102, the contact portions 120, 122 are formed together with the top and bottom PCB tracks 126, 128, whereas the surfaces of the PCB 102 are then laminated with an insulating material except for the contact portions 120, 122. Accordingly, the contact portions 120, 122 are not electrically insulated.

In the example shown in FIG. 10, screw holes 1002 can be used to seal the conductive enclosure 104. Outer electrical contact points 134 are disposed on the top surface 204 between the outer edge 130 and the top contact portion 120. The outer electrical contact points 134 are electrically connected by an external electrical device, e.g. a power source, function generator, a trigger device, etc.

Figure 11:
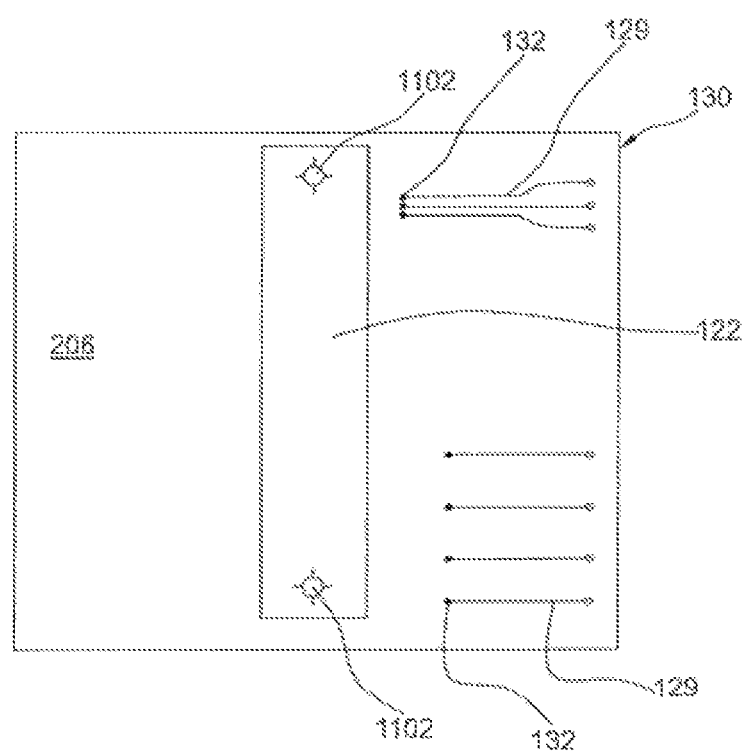
FIG. 11 schematically shows a bottom view of the PCB of FIG. 10.

FIG. 11 shows a schematic top view of the bottom surface 206 of the PCB 102 which is opposite to the top surface 204 shown in FIG. 10. The bottom contact portion 122 is applied on the bottom surface 206 of the PCB and is located offset from the top contact portion 120 in a direction parallel to the bottom surface 206. The electrical vias 132 are therefore located between the front edge 130 and the bottom contact portion 122. The bottom PCB tracks 128 connect the electrical via 132.

Hence, the electrical parts mounted OR the PCB 102 can be electrically accessed from the outside of the conductive enclosure 104 at both sides of the PCB 102.

Figure 12:
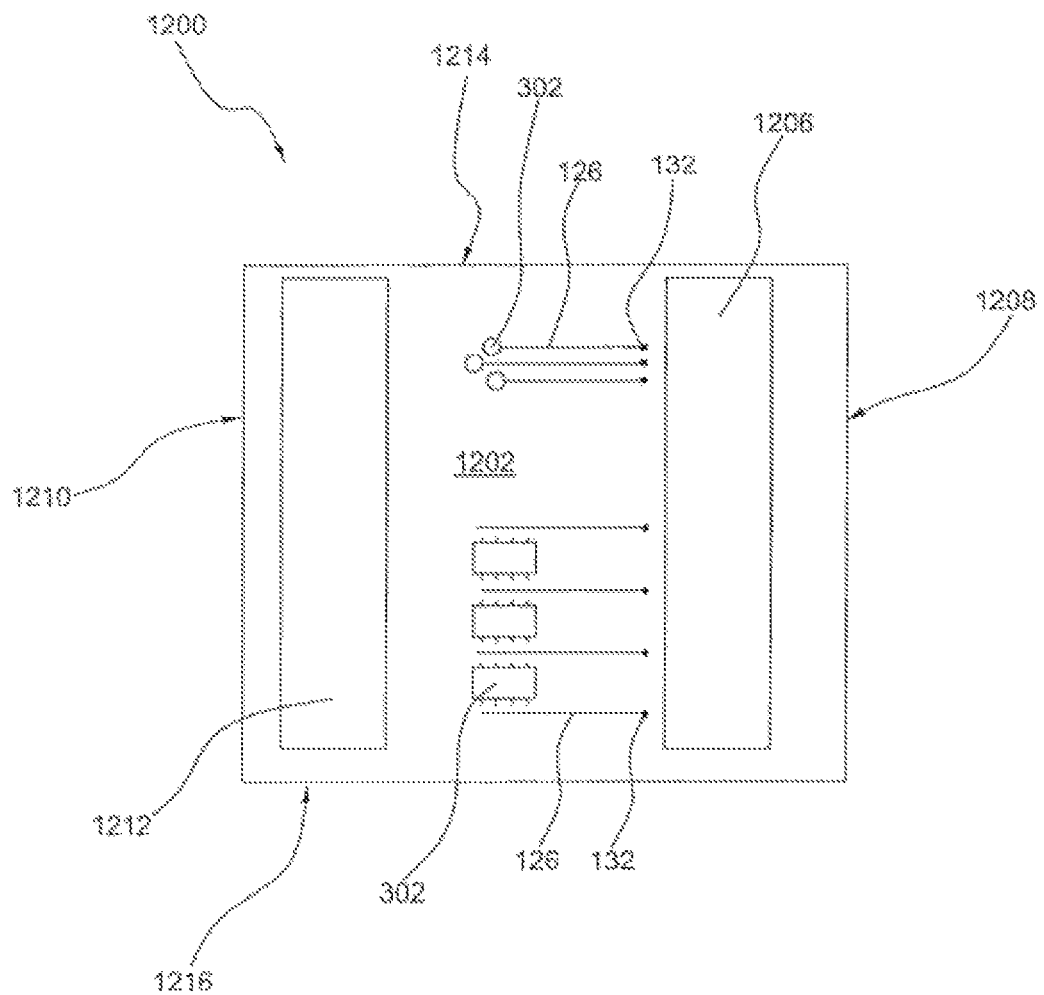
FIG. 12 schematically shows a top view of another example of a PCB of the electrical device.

FIG. 12 shows a schematic top view of a further example of a PCB 1200. Electrical parts 302 are disposed on the top surface 1202. A first top contact portion 1206 is arranged on the top surface 242 and a position close to a front edge 1208 of the PCB 1200. A second top contact portion 1210 is arranged on the top surface 1202 in a position closed to a rear side edge 1212.

Top PCB tracks 126 are disposed on the top surface 1202 and electrically connect the electrical parts 302. The top PCB tracks 126 extend from the respective electrical parts towards die outer edge 1208 and terminate in a position close to the top contact portion 1206 where they are connected to a respective electrical via 132, as described above.

A corresponding conductive enclosure (not shown) having two vertical walls is suited to close a volume about the top surface 1202. In a closed state of the conductive enclosure, the two vertical walls are arranged so as to be in physical contact with the top contact portions 1206, 1212.

In other words, the first and second top contact portions 1206, 1212 correspond to multiple discontinuous sections of the top contact portion of the PCB 1200. Further discontinuous sections of the top contact portion are arranged along side edges 1214, 1216 of the PCB 1200. In a further example, the bottom contact portion comprises multiple discontinuous sections arranged on the bottom surface in a similar way.

The above provides a schematic and simplified illustration of various examples. Electrical parts can be provided on one or both sides of the PCS. These parts can be contacted and connected to form various typos of circuits by PCB tracks provided on either one or both skies of the PCB. The PCB tracks on either sides of the PCB, with in the inner area of the conductive enclosure, can be connected by via. Whereas, in some examples, reference is made to a top PCB track and a bottom PCB track, each of these "tracks" can comprise multiple track portions, including trucks within and outside of the conductive enclosure. Electrical contacts can be provided at near the front edge or at any other part of the PCB extending out of the conductive enclosure; they can be provided on cither one of both sides of the PCB.

The electrical device and its examples as shown in the drawings and described above provide contact portions on both surfaces of the PCB for supporting and being supported on the electrically conductive enclosure. The top and bottom contact portions are offset from one another, thereby forming a gap in between. Conductive via can be provided within the gap allowing for an electrical access to the electrical parts disposed on either surface of the PCB from the outside of the conductive enclosure.

Figure 13:
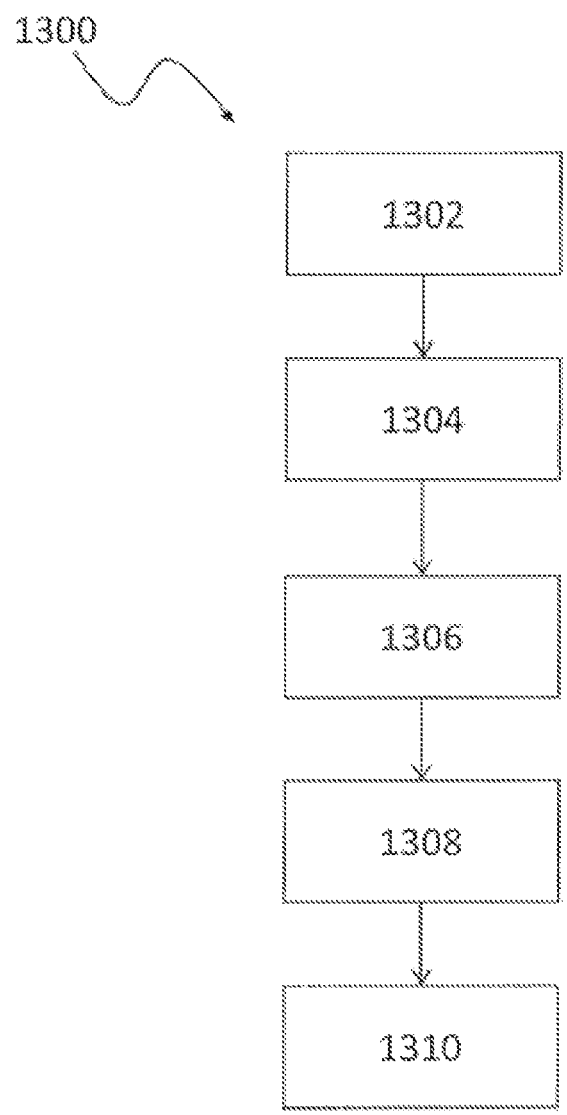
FIG. 13 shows a flow chart illustrating a method for shielding a printed circuit board.

FIG. 13 allows a flow chart illustrating a method 1300 for shielding a printed circuit board. In block 1302, a first contact portion is provided in a first position on a first surface of the printed circuit board. Further, in block 1304, a second contact portion is provided in a second position on a second surface opposite to the first surface of the printed circuit board. As a result, the first contact portion and the second contact portion are offset from one another in a direction parallel to at least one of fixe first surface and the second surface, in a further block 1406, the first contact portion and the second contact portion are electrically connected to one another, in block 1408, a first conductive wall is provided in physical and in electrical contact with the first contact portion. Further, in block 1410, a second conductive wall is provided in physical contact and in electrical contact with the second contact portion. The sequence of the method illustrated in FIG. 13 can be changed.

The invention claimed is:

1. An electrical device, comprising:
   a printed circuit board having a first surface and a second surface;
   a first contact portion disposed on the first surface;
   a second contact portion disposed on the second surface;
   a first conductive wall having a conductive leg in physical and electrical contact with the first contact portion, and a non-conductive leg in physical but not electrical contact with the first surface; and
   a second conductive wall in electrical contact with the second contact portion; and
   wherein the first contact portion and the second contact portion are offset from one another in a direction parallel to at least one of the first surface and the second surface.

2. The electrical device according to claim 1, further comprising
   a conductor path comprising a first track and a second track which are connected to each other by a conductive via,
   wherein the first track is disposed on the first surface,
   wherein the second track is disposed on the second surface, and
   wherein the conductive via runs through the printed circuit board at least partially in a position between the first contact portion and the second contact portion.

3. The electrical device according to claim 2, further comprising
   at least one further conductor path disposed in the interior of the printed circuit board between the first surface and the second surface.

4. The electrical device according to claim 1, wherein
   at least one of the first contact portion and the second contact portion is made of an electrically conductive material.

5. The electrical device according to claim 1, wherein
   at least one of the first conductive wall and the second conductive wall is arranged perpendicular to at least one of the first surface and the second surface.

6. The electrical device according to claim 1, wherein
   both contact portions are in electrical and physical contact with the respective conductive wall.

7. The electrical device according to claim 1, wherein the second conductive wall comprises a conductive leg and an isolated leg, wherein the conductive leg is in physical and electrical contact with the second contact portion, and wherein the isolated leg is in physical contact with the second surface in a position which is distinct from the second contact portion.

8. The electrical device according to claim 7, wherein the isolated leg of the first conductive wall is aligned with the conductive leg of the second conductive wall and the isolated leg of the second conductive wall is aligned with the conductive leg of the first conductive wall.

9. The electrical device according to claim 1, wherein the isolated leg is electrically isolated from the printed circuit board.

10. The electrical device according to claim 1, wherein at least one of the first contact portion and the second contact portion is connected to a reference voltage.

11. The electrical device according to claim 1, further comprising
a housing for enclosing at least one electrical part mounted on the printed circuit board, wherein
at least one of the first conductive wall and the second conductive wall is part of or connected to the housing.

12. The electrical device according to claim 11, wherein
the first contact portion is formed on the first surface of the printed circuit board so as to define a first area and a second area of the first surface, and
wherein the at least one electrical part is mounted within the first area.

13. An electrical device, comprising:
a printed circuit board having first and second surfaces and first and second ends;
a first contact portion disposed on the first surface;
a second contact portion disposed on the second surface;
a first conductive wall electrical contact with the first contact portion;
a second conductive wall supporting the printed circuit board closer to the first end than the second end, the second conductive wall in electrical contact with the second contact portion;
a gapless third conductive wall;
a shelf extending from the gapless third conductive wall parallel to the first and second surfaces, the shelf supporting the printed circuit board at the second end;
wherein the first contact portion and the second contact portion are offset from one another in a direction parallel to at least one of the first surface and the second surface; and
wherein the first conductive wall has a conductive leg in physical and electrical contact with the first contact portion, and a non-conductive leg in physical but not electrical contact with the first surface.

14. The electrical device according to claim 13, further comprising
a conductor path comprising a first track and a second track which are connected to each other by a conductive via,
wherein the first track is disposed on the first surface,
wherein the second track is disposed on the second surface, and
wherein the conductive via runs through the printed circuit board at least partially in a position between the first contact portion and the second contact portion.

15. The electrical device according to claim 14, further comprising
at least one further conductor path disposed in the interior of the printed circuit board between the first surface and the second surface.

16. The electrical device according to claim 13, wherein
at least one of the first contact portion and the second contact portion is made of an electrically conductive material.

17. An electrical device, comprising:
a printed circuit board having a first surface and a second surface;
a first contact portion disposed on the first surface;
a second contact portion disposed on the second surface;
an enclosure in which the printed circuit board is disposed, and comprising:
a first conductive wall in electrical contact with the first contact portion;
a second conductive wall in electrical contact with the second contact portion, the first and second conductive walls forming an external wall of the enclosure; and
a gapless third conductive wall electrically connecting the first and second conductive walls together,
wherein the first contact portion and the second contact portion are offset from one another in a direction parallel to at least one of the first surface and the second surface;
wherein the first contact portion, the second contact portion, the first conductive wall, and the second conductive wall are in electrical contact with one another; and
wherein the first conductive wall has a conductive leg in physical and electrical contact with the first contact portion, and a non-conductive leg in physical but not electrical contact with the first surface.

18. The electrical device of claim 17, further comprising:
a first conductive track on the first surface of the printed circuit board;
a second conductive track on the second surface of the printed circuit board;
a via through the printed circuit board and conductively connecting the first conductive track and the second conductive track,
wherein the first conductive track and the second conductive track are in electrical contact with the first contact portion, the second contact portion, the first conductive wall, and the second conductive wall.

19. The electrical device of claim 18, further comprising:
a shelf extending from the third conductive wall parallel to the first and second surfaces, the shelf supporting the printed circuit board and in electrical contact with the second conductive track,
wherein the third conductive wall and the shelf are in electrical contact with the first contact portion, the second contact portion, the first conductive wall, and the second conductive wall.

* * * * *